(12) United States Patent
Herrault et al.

(10) Patent No.: US 11,972,970 B1
(45) Date of Patent: Apr. 30, 2024

(54) SINGULATION PROCESS FOR CHIPLETS

(71) Applicant: HRL Laboratories, LLC, Malibu, CA (US)

(72) Inventors: Florian G. Herrault, Malibu, CA (US); Joel Wong, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 187 days.

(21) Appl. No.: 17/361,186

(22) Filed: Jun. 28, 2021

Related U.S. Application Data

(60) Provisional application No. 63/073,344, filed on Sep. 1, 2020.

(51) Int. Cl.
*H01L 21/683* (2006.01)
*H01L 21/768* (2006.01)
*H01L 21/82* (2006.01)
*H01L 21/8234* (2006.01)

(52) U.S. Cl.
CPC .... *H01L 21/6836* (2013.01); *H01L 21/76802* (2013.01); *H01L 21/8213* (2013.01); *H01L 21/8234* (2013.01)

(58) Field of Classification Search
None
See application file for complete search history.

(56) References Cited

U.S. PATENT DOCUMENTS

| | | | |
|---|---|---|---|
| 8,617,927 B1 | 12/2013 | Margomenos | |
| 8,802,545 B2 | 8/2014 | Johnson et al. | |
| 9,214,404 B1 | 12/2015 | Margomenos | |
| 9,337,124 B1 | 5/2016 | Herrault | |
| 9,385,083 B1 | 7/2016 | Herrault | |
| 9,508,652 B1 | 11/2016 | Herrault | |
| 9,837,372 B1 | 12/2017 | Herrault | |
| 10,032,670 B2 | 7/2018 | Roesner et al. | |
| 10,957,537 B2 | 3/2021 | Herrault et al. | |
| 10,998,273 B2 | 5/2021 | Herrault | |
| 2002/0110952 A1 | 8/2002 | Gris | |
| 2004/0029362 A1* | 2/2004 | Liu | B28D 1/221 438/460 |
| 2006/0105496 A1 | 5/2006 | Chen | |
| 2006/0252182 A1* | 11/2006 | Wang | H01L 21/6836 257/E21.499 |
| 2007/0025092 A1 | 2/2007 | Lee | |
| 2008/0224320 A1 | 9/2008 | Palmade | |
| 2011/0140216 A1 | 6/2011 | Qu | |
| 2011/0266569 A1 | 11/2011 | Basin | |
| 2012/0037935 A1 | 2/2012 | Yang | |
| 2013/0168803 A1 | 7/2013 | Haddad | |
| 2014/0021610 A1 | 1/2014 | Von Koblinski | |

(Continued)

FOREIGN PATENT DOCUMENTS

KR  10-2013-0117329  10/2013

OTHER PUBLICATIONS

From U.S. Appl. No. 16/158,212 (now published as U.S. Pat. No. 10,998,273), Notice of Allowance dated Jan. 8, 2021.

(Continued)

*Primary Examiner* — Alexander G Ghyka
(74) *Attorney, Agent, or Firm* — Ladas & Parry, LLP

(57) ABSTRACT

An array of III-V material transistors singulated from a Si or SiC wafer disposed on a stretchable tape compatible with pick and place tools and a method of forming same.

6 Claims, 10 Drawing Sheets

(56) References Cited

U.S. PATENT DOCUMENTS

| | | | |
|---|---|---|---|
| 2014/0147650 A1* | 5/2014 | Jiang | ............... C30B 7/105 |
| | | | 428/220 |
| 2014/0203239 A1 | 7/2014 | Schubert | |
| 2016/0111616 A1 | 4/2016 | Margalit | |
| 2016/0293557 A1 | 10/2016 | Topak | |
| 2016/0308270 A1 | 10/2016 | Ding | |
| 2016/0329232 A1 | 11/2016 | Golda | |
| 2017/0363589 A1 | 12/2017 | Kumar | |
| 2018/0019178 A1 | 1/2018 | Lin | |
| 2018/0148328 A1 | 5/2018 | Agache | |
| 2018/0328979 A1* | 11/2018 | Briggs | ............... G01R 31/2642 |
| 2019/0198449 A1 | 6/2019 | Herrault et al. | |
| 2020/0152465 A1 | 5/2020 | Herrault | |
| 2020/0259070 A1* | 8/2020 | Moe | ............... H10N 30/079 |

OTHER PUBLICATIONS

From U.S. Appl. No. 16/158,212 (now published as U.S. Pat. No. 10,998,273), office action dated Dec. 4, 2020.
From U.S. Appl. No. 16/158,212 (now published as U.S. Pat. No. 10,998,273), office action dated Jul. 29, 2020.
From U.S. Appl. No. 16/158,212 (now published as U.S. Pat. No. 10,998,273), office action dated Jan. 16, 2020.
From U.S. Appl. No. 16/158,212 (now published as U.S. Pat. No. 10,998,273), office action dated Jul. 26, 2019.
From U.S. Appl. No. 16/557,811 (now published as U.S. Pat. No. 10,957,537), Notice of Allowance dated Nov. 16, 2020.
From U.S. Appl. No. 16/557,811 (now published as U.S. Pat. No. 10,957,537), Office Action dated May 11, 2020.
PCT International Search Report and Written Opinion from PCT/US2018/055516 dated Feb. 1, 2019.
PCT International Search Report and Written Opinion from PCT/US2019/050384 dated Jan. 20, 2020.
PCT International Preliminary Report on Patentability (Chapter I) with Written Opinion from PCT/US2018/055516 dated Jun. 23, 2020.
Chinoy, P. et al., "Manufacture of low-loss microwave circuits using HMIC technology," 1994 IEEE MTT-S International Microwave Symposium Digest (Cat. No. 94CH3389-4), San Diego, CA, USA, 1994, pp. 1137-1140 vol. 2. doi: 10.1109/MWSYM.1994.335544.
"Productivity Improvement Using Plasma-based Die Singulation" D. Pays-Volard, et al., CS Mantech Conference, May 19-22, 2014.
"Fast high yield cutting of 4 and 6 inch SiC-wafer using thermal laser separation (TLS)", Belgardt, C., Lasers in Manufacturing Conference 2017.
"Plasma cutting brings finesse to chip production", Kimura, M. Nikkei Asian Review, Feb. 9, 2015.

* cited by examiner

SINGULATION PROCESS FOR CHIPLETS

CROSS REFERENCE TO RELATED APPLICATIONS

This application claims the benefit of US Provisional Patent Application Ser. No. 63/073,344 filed 1 Sep. 2020 and entitled "Massively-Parallel Singulation Process for sub-mm-scale GaN Transistor Chiplets", the disclosure of which is hereby incorporated herein by reference.

The technology disclosed herein is related to that disclosed by U.S. Provisional Patent Application Ser. No. 62/610,099 filed 22 Dec. 2017 and entitled "Hybrid Integrated Circuit Architecture" and its corresponding U.S. Non-Provisional patent Application Ser. No. 16/158,212 filed Oct. 11, 2018, which has the same title as the provisional application. The disclosures of the foregoing are hereby incorporated herein by reference.

The technology disclosed herein is also related to that disclosed by US Provisional patent Application Serial No. 62/758,825 filed 12 Nov. 2018 and entitled "Methods to Design and Uniformly Co-fabricate Small Vias and Large Cavities through a Substrate" and its corresponding U.S. Non-Provisional patent application Ser. No. 16/557,811 filed 30 Aug. 2019, which has the same title as the provisional application. The disclosures of the foregoing are also hereby incorporated herein by reference.

STATEMENT REGARDING FEDERALLY SPONSORED RESEARCH OR DEVELOPMENT

This invention was made with Government support under Government Contract HR0011-19-C-0006. The Government has certain rights in the invention.

TECHNICAL FIELD

A singulation (dicing) process for use chiplets. The chiplets may comprise, for example, sub mm scale transistor chips and/or passive devices, but the chiplets may be of a larger size than a sub mm scale.

BACKGROUND

There exists a need in the art for manufacturing a device wafer or chip comprising an integrated circuit having a through-wafer or through-chip receiving cavity (which cavity may be filled, during manufacture, with a small component sometimes referred to as 'chiplets'), which need is addressed in US application Ser. No. 16/158,212 filed 11 Oct. 2018. That application discloses Metal-Embedded Chip Assembly for Microwave Integrated Circuits (MECAMIC) devices and processes and teaches the embedding, at the wafer-level, of microelectronic transistor chiplets into a device wafer or chip that may have pre-fabricated interconnects and integrated circuits such as, for example, passive components. This allows for much a faster manufacturing of the device, at lower cost, and a scaling up of transistor technologies to circuits without cost and cycle time burden.

These chiplets may comprise a GaN or other semiconductor chemistry devices or even passive devices (resistors, capacitors, on a substrate, such as, for example, a SiC substrate. Such chiplets may be used in the manufacture of the MECAMIC devices described in US patent Application Ser. No. 16/158,212 or in other applications. The device wafers or chips into which the chiplets are embedded may be made by a lower cost manufacturing process than that used for the chiplets.

A large number of microelectronic transistor chiplets can be manufactured on a single wafer, but the number that can occupy the wafer depends on their packing density and that, in turn, depends on how much "real estate" is taken up in the regions between chiplets. That "real estate" is called "streets" in the art since the "streets" often follow a grid like pattern separating the transistor(s) of the chiplets from the transistors of neighboring chiplets and provide an avenue for separating the chiplets from one another. The "streets" reduce the packing density, and the packing density (and thus the number of chiplets that a single wafer can accommodate) depends at least in part on the widths of the streets. Narrower streets improve packing density and thus allow for more chiplets of a given size to be packed onto a wafer thereby reducing the cost of making a chiplet. The street width(s) depend upon the technology used to separate the chiplets. The physical separation of the chiplets of a wafer is referred to as dicing or singulation in the art. Some dicing or singulation technologies may require wider streets than other dicing or singulation technologies.

The cost of making the device (such as the MECAMIC devices noted above) which receives one or more chiplets in its cavity or cavities not only depends on the cost of making the chiplets, but also on the cost of placing the chiplet(s) in the cavity(ies) and connecting them with components on the device wafer or chip. So the ease by which the chiplets are placed into the cavities of the device wafer or chip and the ease by which they are electrically connected to the device wafer or chip are factors which should be considered when considering reducing the packing densities of the chiplets on the wafer from which they are made.

The prior art with respect to dicing of chips includes:

Roesner, et al., U.S. Pat. No. 10,032,670 issued 24 Jul. 2018 for "Plasma dicing of SiC chips". SiC chips are plasma etched through to an etch stop layer which holds the chips together. The SiC chips are then separated from each other by cleaving the etch stop layer.

D. Pays-Volard, et al. "Productivity Improvement Using Plasma-based Die Singulation", CS MANTECH Conference, May 19th-22nd, 2014. This paper focuses on silicon plasma dicing using conventional dicing tape frames.

Johnson, et al., U.S. Pat. No. 8,802,545 issued Aug. 12, 2014 for "Method and apparatus for plasma dicing a semiconductor wafer". It provides a unique tool (and very expensive) to singulate semiconductor wafers directly on dicing tape and ring frames. It does not describe SiC wafer singulation and does not discuss co-fabrication of vias.

Belgardt, C., "Fast high yield cutting of 4 and 6 inch SiC-wafer using thermal laser separation (TLS)", Lasers in Manufacturing Conference 2017.

Kimura, M. "Plasma cutting brings finesse to chip production", Nikkei Asian Review, 9 Feb. 2015. This article describes plasma dicing and mentions SiC etching.

Based on the prior art, there is currently no technique to singulate sub-mm-scale GaN transistor chiplets, preferably while also co-fabricating transistor vias, and transferring those chiplets on tape for pick and place into cavities in semiconductor chips having differing chemistries such as, for example, silicon-based CMOS chips.

BRIEF DESCRIPTION OF THE INVENTION

A method of forming an array of group III-V material components singulated from a wafer with streets between neighboring components having a width less than 50 μm and with ground vias etched at the same time as the streets and with a common sidewall profile as the streets and disposing the array of III-V material components on a stretchable tape compatible with commercially available pick and place tools such as the Photon Automatic High Precision Die Attach System made by ATM Pacific Technology of Singapore. The wafer may be made from Si or SiC or other suitable material(s).

An array of components, preferably transistors formed from group III-V materials, singulated from a wafer, preferably formed from Si or SiC, disposed on a tape, compatible, in use, with pick and place tools with neighboring components on the tape being spaced from each other by a distance preferably no greater than 50 μm. The tape, compatible, in use, with pick and place tools, is preferably a stretchable tape which allows the aforementioned distance between neighboring components to be increased for said pick and place tools to a distance greater than 50 μm by stretching the stretchable tape.

A method of forming an array of components, preferably transistors formed utilizing a III-V material chemistry system, singulated from a wafer, the wafer preferably being formed of SiC, disposed on a stretchable tape, the method comprising: forming the components on the wafer; temporarily adhering the components on the wafer face down on a carrier substrate using an adhesive; applying a mask to backside of the wafer with apertures therein aligning with streets between the components; etching through the mask to singulate the components; adhering a tape to the mask or to the backsides of the singulated components if the mask has been previously removed; dissolving the adhesive thereby releasing the singulated components adhered to the tape from the carrier substrate; replacing the tape with a stretchable tape compatible with pick and place tools. The first mentioned tape is preferably replaced with the stretchable tape by temporarily bonding a substrate to front sides of the singulated components; removing the first mentioned tape and adhering the stretchable tape from where the first mentioned tape was removed.

DETAILED DESCRIPTION

Figure 1:
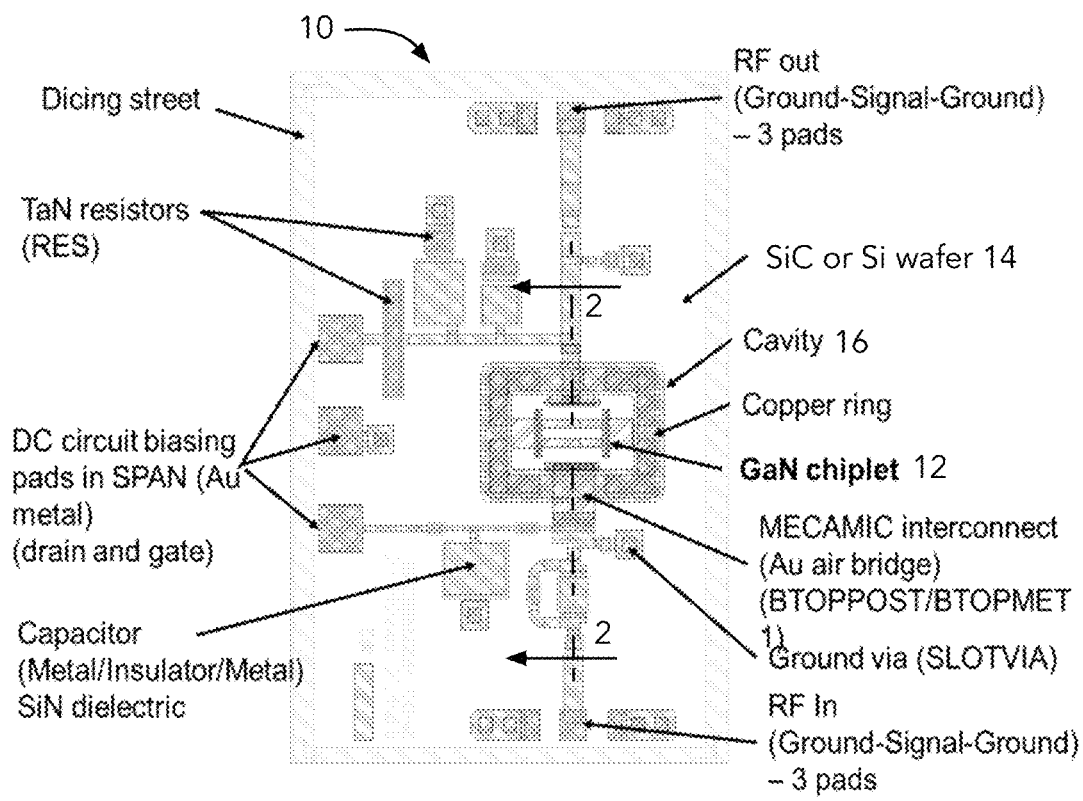
FIG. 1 depicts an exemplary MECAMIC circuit which preferably has a relatively small active circuit (with a GaN transistor for) embedded in a cavity within a relatively larger chip or wafer (typically formed with passive, non-active elements on or in a SiC or Si substrate). The small active circuit (with a single GaN transistor, for example) can be made with high yield rate, whereas if the both the GaN transistor and the passive, non-active elements were made on a common substrate then yield rates would be lower, so the MECAMIC circuit design scheme improves yields and gains the high performance that GaN (or other III-V chemistry) transistors provide. This figure highlights the need for small III-V chiplets disposed within a larger Si chip or wafer and that a keep-out area between the transistor and the edge of the chiplet be small, to minimize loss due to interconnect length and thus to help in attaining high performance.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

This presently disclosed technology provides a method to singulate GaN transistors chiplets (50-450 μm in dimensions) while etching backside vias in preferably SiC substrates (which are preferably 25-100 μm thick) and transferring clean chiplets onto pick-and-place tape with a high yield. This technology can be used with transistor chiplets and substrates utilizing other chemistries than those just mentioned.

Heterogeneous integration of transistor chiplets has gained significant momentum for the past 10 years as circuits become more complex and new device technologies offer performance improvements in key areas of legacy technologies. This is the "best junction for the function" approach. A technology called MECAMIC (Metal-Embedded Chip Assembly for Microwave Integrated Circuits) employs transistor chiplets that are embedded in the volume of low-cost interposer wafers. This technique allows for the fabrication of microwave integrated circuits at a much lower cost than traditional monolithic techniques would involve.

To better realize the potential of this technology, especially at mm-wave (e.g., ka-band and above), the transistor chiplets must be compact—i.e., the area occupied by the transistor must represent a significant portion of the chiplet area (so that they have a small "keep out" area). In turn, this allows for short interconnects between the transistors and the circuits.

The MECAMIC concept allows high performance III-V (such as GaN) transistor chiplets to be fabricated on III-V material wafers. Those skilled in the art realize that transistors fabricated from III-V materials, such as GaN, offer higher performance than if they were made from Si material, but at a higher cost. Because the III-V chiplets 12 (see FIGS. 1 and 2) are small in size (they typically contain a single transistor), they can be fabricated at high yield and low cost per chiplet 12. Larger interposer wafers 14 can also be fabricated at high yield, but at a lower cost since they can be made from SiC or Si wafers. Passive components, such as resistors and capacitors can be formed in an interposer wafer 14, along with contact pads and backside vias, if desired. The interposer wafer 14 may include multiple layers such as a SiC interposer layer 14-1 and another layer such a dielectric (such as Benzo-Cyclo-Butane BCB) layer 14-2. One or more cavities 16 are etched into the interposer wafer 14 for receiving the III-V material chiplet(s) 12. Through the MECAMIC assembly process, one or more III-V material chiplets 12 can be integrated and interconnected with the passive components on a silicon interposer wafer 14 to realize a hybrid MECAMIC circuit 10, which has high performance III-V transistors imbedded in a SiC or silicon wafer. The cost of making the hybrid circuits 10 is less expensive compared to making the circuits solely from III-V material, but the hybrid circuits 10 still enjoy the advantages of utilizing high performance III-V transistors (by the utilization of III-V material chiplets 12). The reader may wish to consult the related applications identified above for additional information regarding the MECAMIC assembly process.

This document focuses on the transistor chiplet 12 (see, for example, FIGS. 1 and 2) after it has been fabricated and its preparation for installation in cavity 16 using a pick and place machine. See also FIGS. 4a-4m which depict one method for preparing the transistor chiplet 12 for eventual insertion in cavities 16 by a pick and place machine. It should be realized however, that the chiplet 12 does not necessarily have to include a transistor. The processes described herein do not depend on the chiplet 12 having one or more transistors. But it is the presence of one of more transistors, for example, on a chiplet 12 made using a relatively expensive manufacturing process which chiplet 12 will be inserted in cavity 16 of wafer made using a relatively less expensive manufacturing process that makes the presently invention so desirable.

Figure 2:
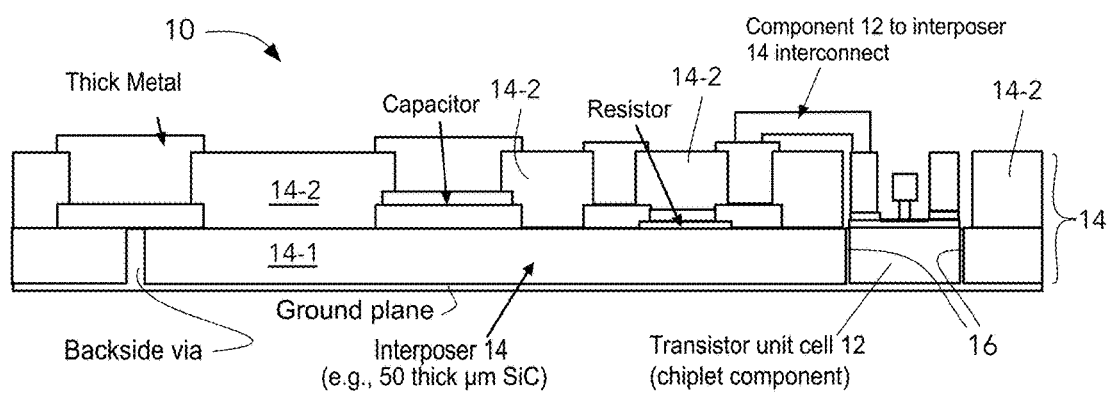
FIG. 2 is a cross section view of another embodiment of a MECAMIC circuit described in greater detail in U.S. Non-Provisional patent application Ser. No. 16/557,811, filed 30 Aug. 2019 noted above, this section view more or less corresponding to the section line 2-2 of FIG. 1.

FIG. 1 shows, in a plan view, a representative circuit layout 10, highlighting a RF GaN HEMT Transistor chiplet 12 after it has been embedded in cavity 16 in a Si or SiC wafer that contains resistors, capacitors, interconnects or perhaps other devices and components as well. A section line 2-2 is shown on FIG. 1 which generally corresponds to a cross-section view shown in FIG. 2. FIG. 2 is a schematic representation while FIG. 1 is a CAD drawing (with different cross-hatch shadings, etc.), so FIG. 2 is somewhat simplified compared to FIG. 1. FIGS. 1 and 2 illustrate a need for small transistor chiplets 12 having high dimensional accuracy thereby allowing for tight fit tolerances within cavity 16 that receives the chiplet 12.

Figures 3A, 3B:
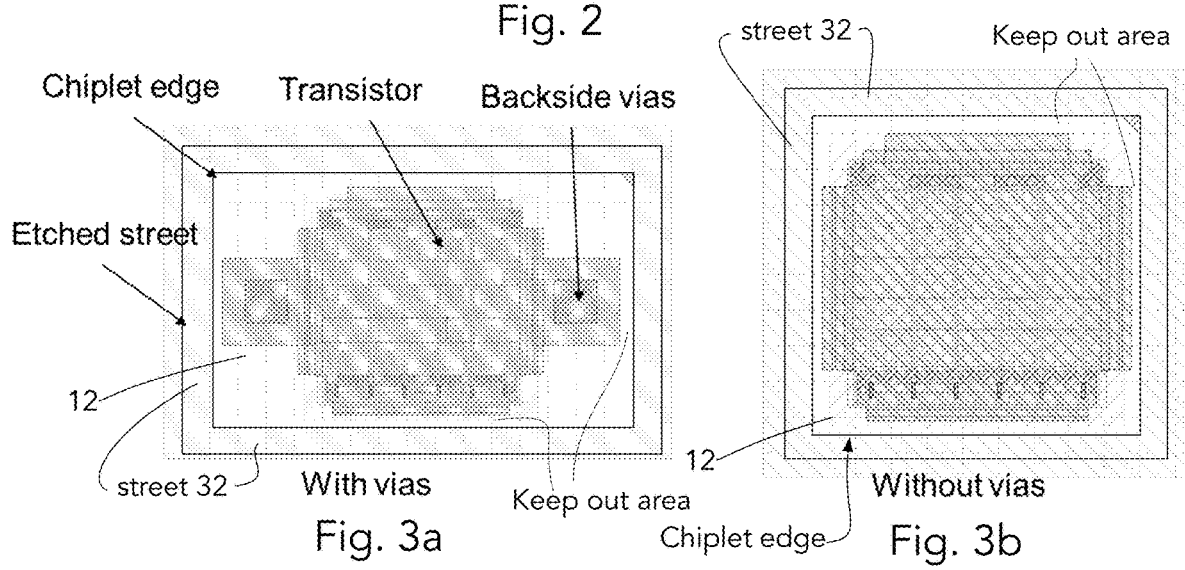
FIGS. 3a and 3b show representations of the singulated chiplets, with and without vias.

FIGS. 3a and 3b are plan views of two embodiments of a chiplet 12, one with backside vias (see FIG. 3a) and another without backside vias (see FIG. 3b). A larger number of chiplets 12 can be made from a wafer of III-V material compared to manufacturing circuits 10 using the same wafer of III-V material. Each chiplet 12 is surrounded (and spaced from other chiplets 12 in the wafer) by a street 32 which is etched when the chiplets 12 are singulated. The backside (or grounding) vias, if utilized, are preferably etched at the same time as the streets 32 and preferably with the same sidewall profile as the streets. The streets 32 encompass or encircle the backside (or grounding) vias, if used, and also encompass or encircle the bodies of the transistor(s) of the chiplets 12. Moreover, the streets 32 are preferably spaced from the bodies of the transistors and the backside (or grounding) vias (if such vias are utilized) by at least a keep out area or distance to help ensure the singulation process of etching the streets 32 does not cut into the bodies of the transistors and/or the backside (or grounding) vias (if such vias are utilized).

Figure 4A:
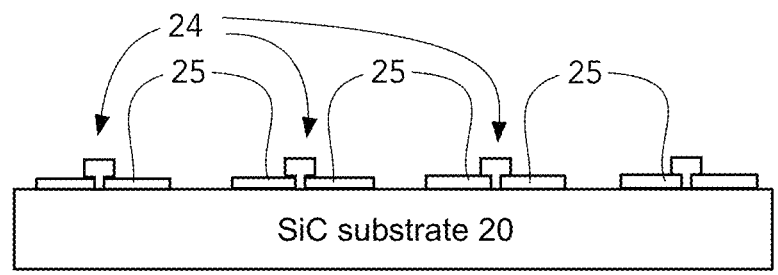
FIGS. 4a-4n show a process for making the chiplets ready for placement in cavities of the MECAMIC circuit using a pick and place machine.

To fabricate the chiplets 12, preferably as GaN HEMT chiplets, traditional III-V IC fabrication techniques may be utilized up to backside thinning. FIG. 4a depicts a semiconductor wafer formed of a SiC substrate 20 (for example) with arrays of fabricated III-V material transistors 24 and metal pads 25. Each transistor and its associated pads 25 will eventually form a chiplet 12. The substrate 20 thickness may be 500 microns thick and may comprise a 4" or larger diameter wafer.

Figure 4B:
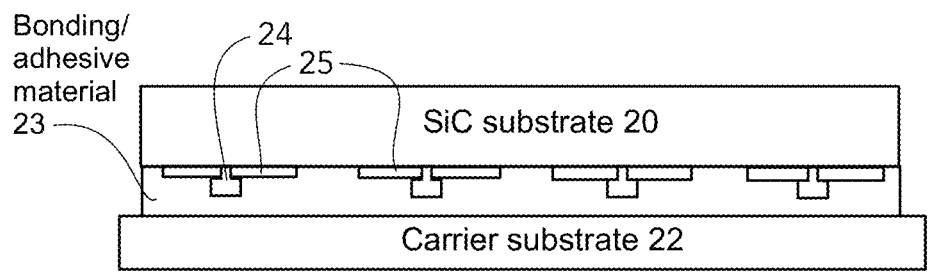
Figure 4C:
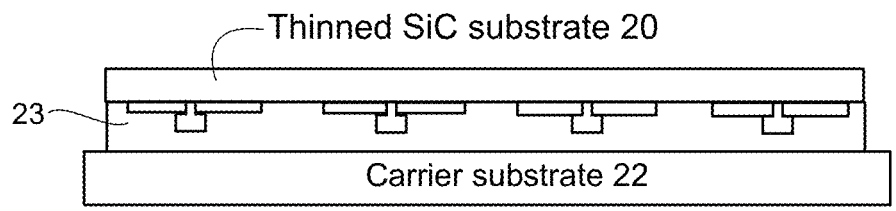

As is shown in FIG. 4b, the wafer (e.g., the SiC substrate 20) with transistors 24 and metal pads 25 is mounted face down on a carrier substrate 22 (e.g., silicon) with a bonding material 23 (e.g., a HT-10.11 bonding material made by Brewer Science). Next, as is shown by FIG. 4c, the wafer (e.g., SiC substrate 20) is preferably thinned down by means of mechanical grinding and polishing to preferably a substrate thickness of about 50 µm (±5 µm) so that the amount of etching described below with reference to FIG. 4e is reduced. A desired substrate 20 thickness of ~50 µm is selected due to its RF characteristics, but this process may be utilized for substrate 20 thicknesses ranging from 1 to 500 microns, but more preferably ranging from 25 to 100 microns in thickness.

Figure 4D:
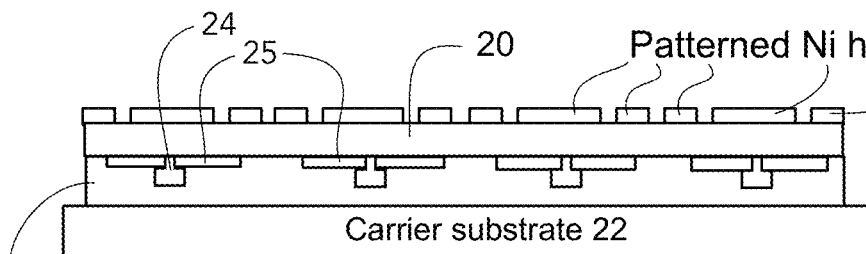
Figure 4E:
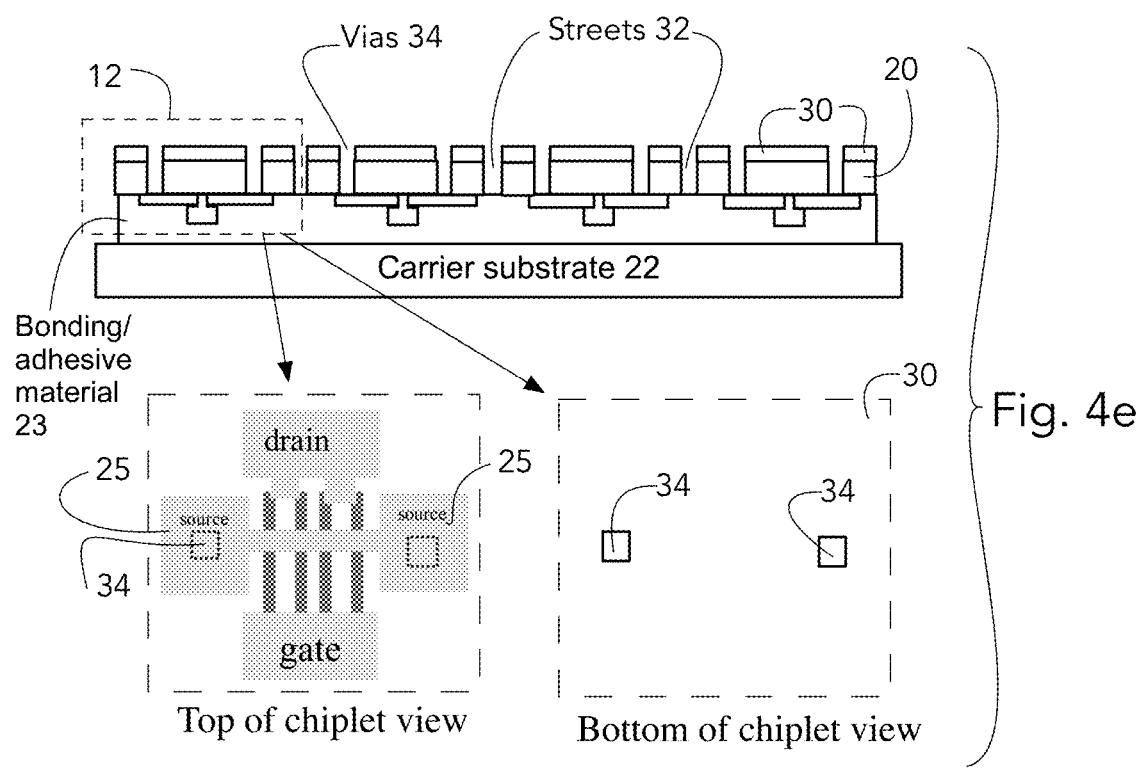

Next, see FIG. 4d where a hard mask 30, preferably formed of Ni, is electroplated through a photoresist pattern (not shown) to form regions of Ni on substrate 20. The nickel mask 30 acts as an etching mask and is approximately 3 µm thick for 50-µm thick wafer 20. The steps for forming the patterned Ni mask 30 may comprise: a) pattern a resist mask for backside alignment marks and align it directly with the frontside patterns of the III-V material transistors, b) etch alignment marks in the SiC substrate (<1 urn depth) with a plasma dry etch, c) remove the resist mask, d) sputter a Ti/Au membrane (100/1000 Å thick, not shown), d) spin coat a thick resist (5-6 μm thick), e) align it with respect to backside alignment marks and pattern it by traditional means of photolithography, f) electroplate nickel (preferably 3 μm±1 μm thick for a 50 μm thick SiC substrate, g) strip the resist, h) etch away the exposed thin Ti/Au membrane (the Ti/Au membrane, if utilized, remains after underneath hard mask 30 after etching the exposed membrane, but is not shown for ease of illustration). The resulting patterned nickel hard mask 30 serves as a masking etch material for SiC etching. One can note that the keep-out area between the chip edge and the chiplet active region (see FIGS. 3a and 3b) may be small (<30 urn). The size chiplets 12 of FIGS. 3a and 3b are approximately 200 microns per side.

By means of plasma etching (preferably by a SF6-based plasma etch), streets 32 (for singulation) and vias 34 (for transistor source backside grounding, if used) are etched (preferably simultaneously) into the SiC substrate 20 using the patterned Ni mask 30 as is shown by FIG. 4e thereby effectively singulating the chiplets 12. The street is a term used to indicate the separation between chips (or chiplets). The vias 34 land on the backside metal pads, while the street 32 is etched to the bonding material 23. Preferentially, the vias 34 and the streets 32 preferably have the same width (30 to 50 μm) so that the etch rate of the vias 34 are similar to the etch rate of the streets 32, with, in this embodiment, a ~2:1 aspect ratio (substrate thickness/via width), but the process is generally compatible for aspect ratios up to 10:1, and substrate thicknesses up to 500 μm (with an appropriate hard mask 30 thickness).

It should be noted that the backside vias 34 have metal at the bottoms thereof, but no metal on the sidewalls and on the surface of the backside SiC substrate at this stage. Complete metallization of the vias 34 (sidewall+backside) may only happen during the chiplet integration process. See U.S. Non-Provisional patent Application Ser. No. 16/158,212 filed Oct. 11, 2018 noted above. Of course, if backside vias are not utilized (see FIG. 3b), then there would be no vias 34 to be filled with a contact metal. The hard mask 30 can be optionally removed at this stage by means of chemical etching, if desired.

Demounting the singulated chiplets 12 can be challenging. HT-10.11 bonding material demount techniques typically require a mechanical slide at 200° C. for full wafers. This is typical for mounting materials that must withstand SiC etching temperatures in excess of 100° C. for a significant period of time. Because the chiplets 12 are already individualized (singulated), one cannot slide the "wafer" as is. Therefore, a process transfer technique is used which will now be described that begins with utilizing a thermal release adhesive tape 33.

Figure 4F:
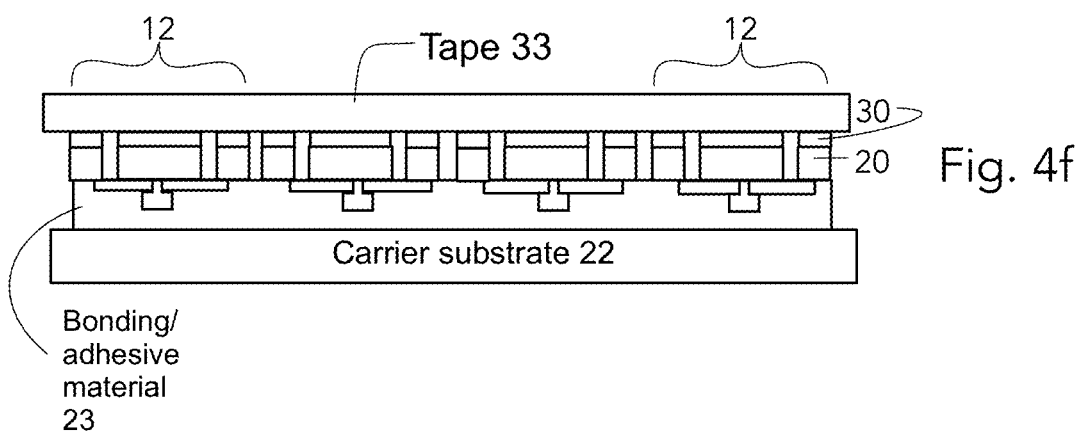

Turning now to FIG. 4f, a thermal release adhesive tape 33, made by Nitto Denko, for example, is laminated onto the backside of the etched and singulated chiplets 12 preferably at room temperature. In FIG. 4f, the hard mask 30 is still present, so the tape 33 is laminated onto the remaining pattern of hard mask 30, otherwise it may be laminated onto the remaining thinned SiC substrate 20 of the chiplets 12. Any tape, single or double-sided, whose liner and adhesive is able to function at elevated temperatures (>180C) may be suitable. The tape 33 should also be able to retain adhesion through the cleaning solution for the temporary bond material 40 mentioned below.

Figure 4G:
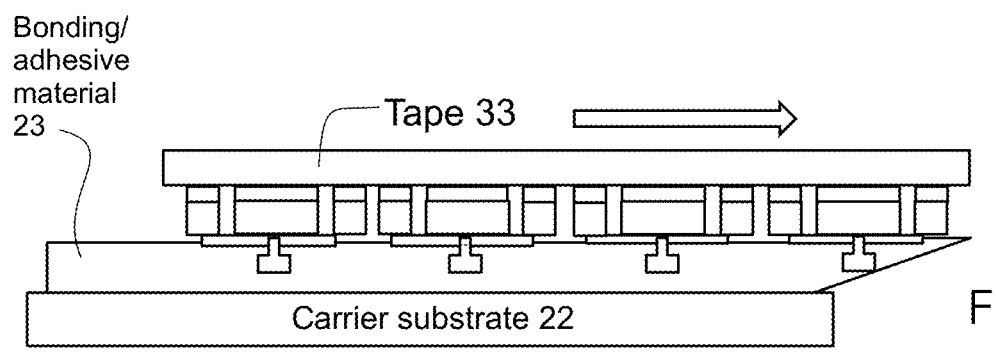
Figure 4H:
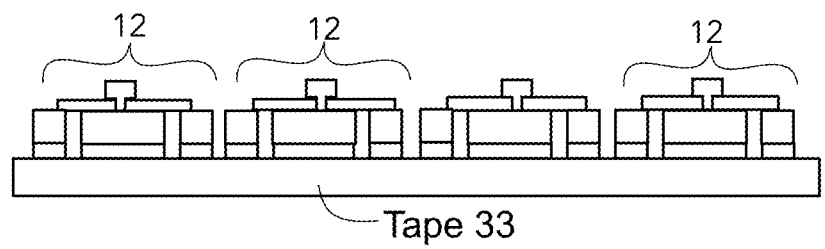

Because the surface area of the chiplets 12 is so small, the bonding strength to the bonding material 23 is minimal, therefore, it is possible to peel or slide off the chiplets 12 from the carrier substrate 22 without damage using tape 33. Through mechanical peeling or sliding under heat (>180° C.) of the tape 33 (for example, in the direction of the arrow), arrays of transistor chiplets 12 on tape 33 are removed, as is shown by FIG. 4g, from the carrier substrate 22. We have determined that a plurality of chiplets 12 ranging from 0.1 to 2 mm in width and length can be simultaneously peeled from the carrier substrate 22. This was demonstrated on 4" SiC substrate wafers 22 with yield exceeding 90%. Any residues of the adhesive layer on chiplets 12 should be removed if present. As such, the chiplets 12 are preferably chemically cleaned, removing any remaining HT-10.11 bonding material 23, with a solvent, such as Waferbond Remover also by Brewer, leaving the cleaned chiplets 12 still laminated to tape 33 as shown by FIG. 4h. Those practicing this technology may find a bonding material 23 other than HT-10.11 and a solvent other than Waferbond Remover, to be suitable to their needs.

Figure 4I:
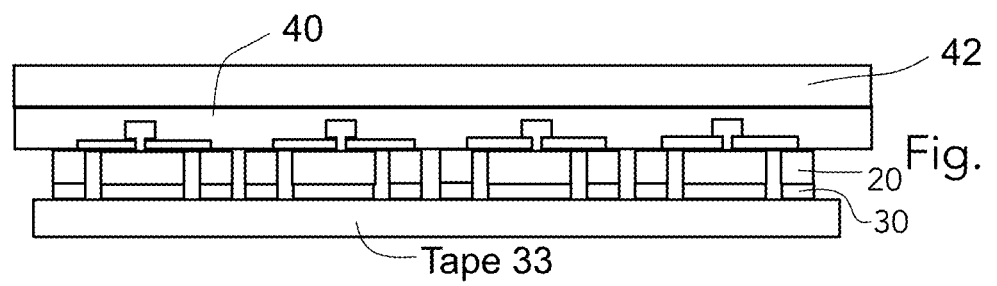
Figure 4J:
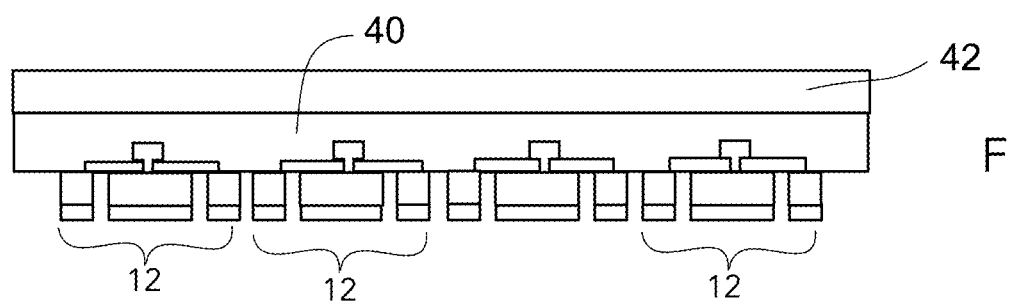
Figure 4K:
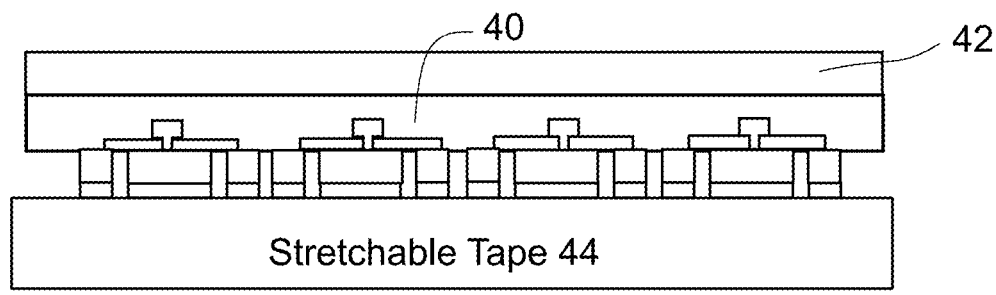
Figure 4L:
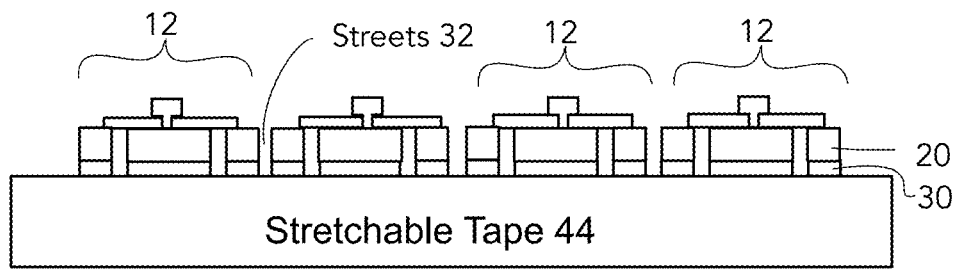

Next, the chiplets 12 are laminated into another substrate 42 using a low temperature temporary bond material 40 as can be seen in FIG. 4i. CrystalBond 555 is preferred, but other low temperature materials may be suitable as well for bond material 40. Then (see FIG. 4j) the tape 33 is removed through mechanical peeling and the chiplets 12 are then laminated onto stretchable tape 44 (see FIG. 4k), preferably at room temperature.

Substrate 42 is removed by removing the temporary low temperature bond material 40. Crystalbond 555, preferably used as material 40, is solvable in water. Heating to >50° C. is preferred. See FIG. 4l.

Figure 4M:
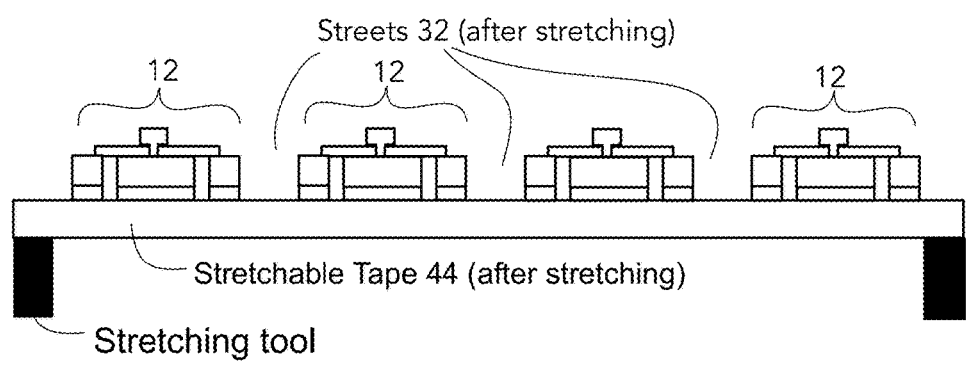
Figure 4N:
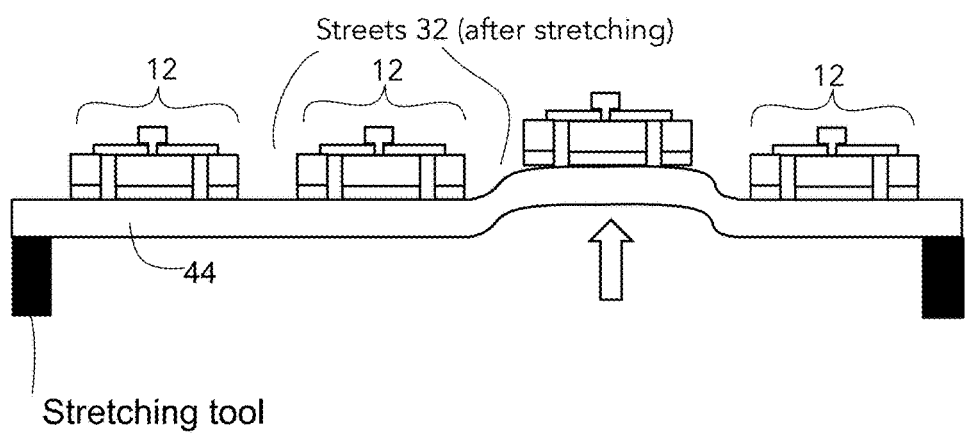

The chiplets 12 at this stage have the same pitch as they had when formed on the SiC substrate shown in FIG. 4a. That pitch is too small (the chiplets 12 are too closely spaced, that is, the streets 32 between them are too narrow) for modern pick and place machines to install them in cavities 16 in interposer 14 (see FIG. 2). But the stretchable tape can be stretched (see FIG. 4m) and held stretched allowing the chiplets 12 to be spaced apart at a distance (for example, the streets 32 can stretch to be ~1 mm wide) compatible with a pick and place machine being used to place them into cavities 16. FIG. 4m shows the tape 44 being stretched laterally (horizontally in that figure), but the tape 44 can also (or alternatively) be stretched in a vertical direction by pushing up on each chiplet 12 when a chiplet 12 needs to be handled by the pick and place machine as shown by the arrow in FIG. 4n. The pick and place machine utilized can preferably accomplish the vertical displacement of the chiplet 12 shown by the upward arrow in FIG. 4n by using a needle ejector. Then the pick and place machine picks up the chiplet using a vacuum tool.

Figure 5:
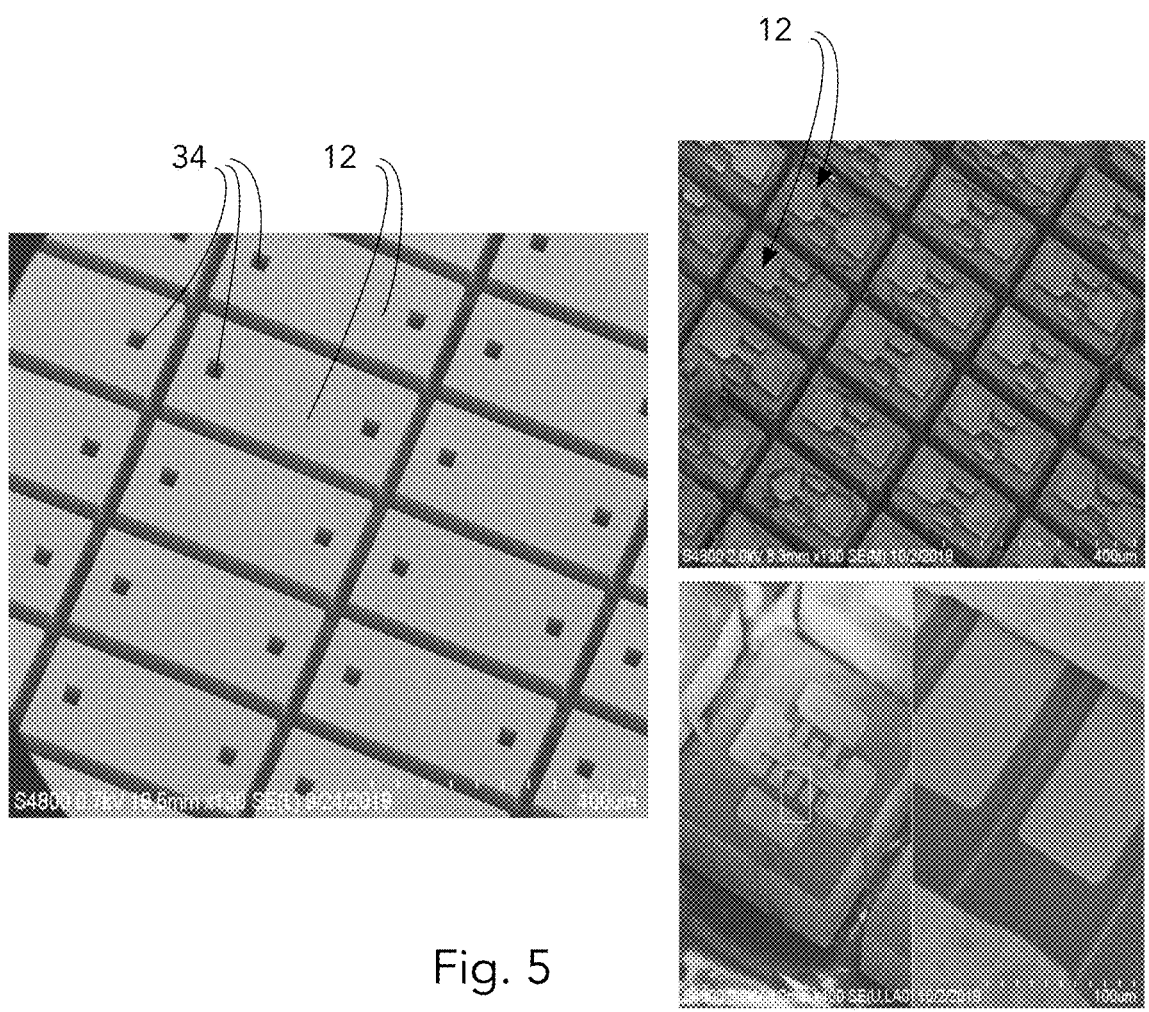
FIG. 5 are SEM micrographs of vias of (left) plasma singulation with via fabrication, and (right) chiplet after demount.

FIG. 5 are SEM micrographs of vias 34 (on the left-hand side) after plasma singulation and via fabrication of the chiplets 12 and (on the right hand-side) chiplets 12 (mostly front views) after demount.

Figure 6:
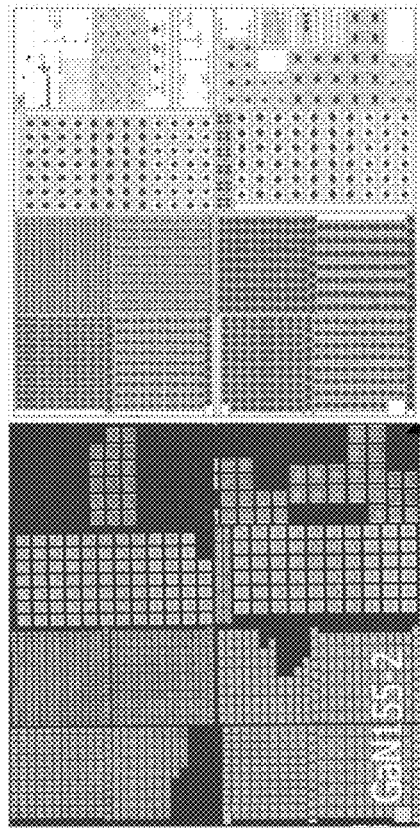
FIG. 6 provides yield data of the singulation and transfer process: Image compares a reticle with the CAD design—most of the missing chiplets are large test structures (layout optimization would result in yield increase), but it corresponds to a 96% chiplet yield for this 10×12 mm reticle. All tested transistor chiplets dimensions (types A-K) have successfully been transferred (see tables).
Figure 7:
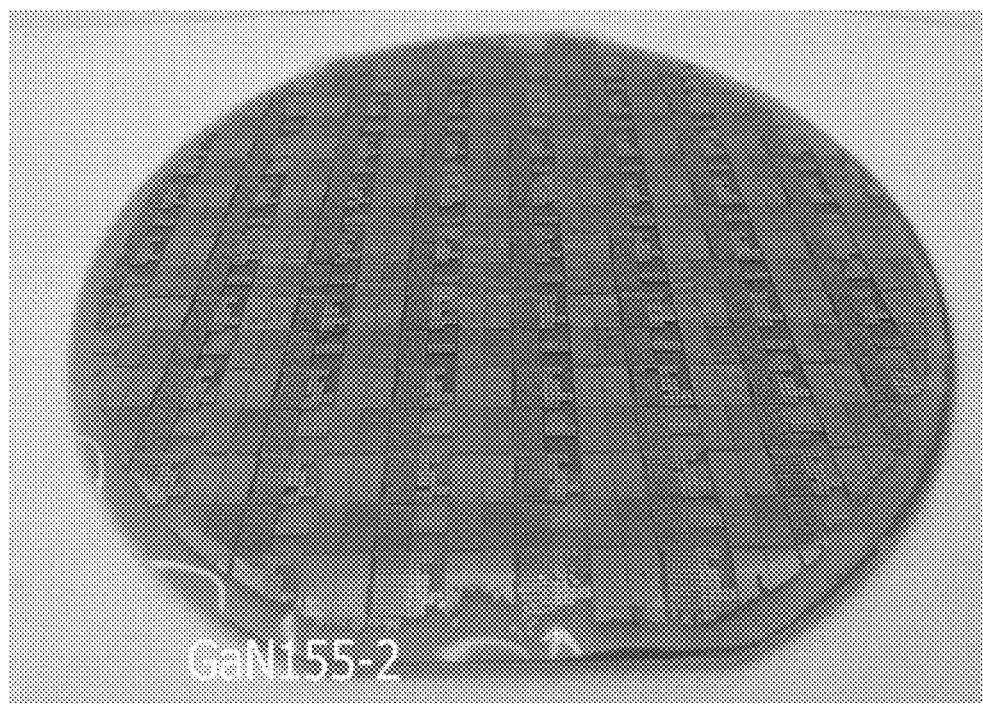
FIG. 7 is an image of a multitude of chiplets formed on a wafer, the chiplets being preferably singulated at the same time in a massively parallel operation using the processes described herein in as much as 500,000 or more chiplets may be singulated at the same.

FIG. 6 shows the result of a 10×12 mm reticle with chiplets 12 transferred onto tape and a comparison against the CAD file. Note that only the larger chips did not transfer as well during our initial attempts. But we have subsequently found that larger chips (greater than a mm in size, for example) can be successfully transferred with the process described herein. Summary tables evaluating transfer yield are also presented. For each chiplet design/size, we demonstrated 100% transfer in some reticles, with a total reticle yield up to 95%. For this wafer, the average yield across the entire wafer was 75% (as indicated by FIG. 7). Through layout optimization, it is likely that 99% singulation and transfer yield can be achieved. With this layout and a 75% transfer yield, a quantity of over 50,000 chiplets was successfully fabricated out of 1 wafer, and ready for heterogeneous integration.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of. . . . "

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A method of forming a two-dimensional array of components singulated from a wafer and temporarily adhered as a two-dimensional array on a stretchable tape, the method comprising: forming the two-dimensional array of components on and/or in the wafer with streets between neighboring transistors in said two-dimensional array; temporarily adhering an exposed portion of each component on and/or in the wafer face down on a carrier substrate using a temporary adhesive; etching, thru the wafer, apertures aligning with the streets between neighboring components to singulate the components; adhering a stretchable tape to the backsides of the two-dimensional array of components; and dissolving the adhesive thereby releasing the two-dimensional array of singulated components adhered to the stretchable tape from the carrier substrate.

2. The method of claim 1 wherein the components are III-V material transistors and the wafer is Si or SiC.

3. The method of claim 1 wherein said etching, thru the wafer, apertures aligning with the streets between neighboring components to singulate the components comprises:
   applying a mask to a backside of the wafer with apertures therein aligning with the streets between neighboring components; and
   etching thru the mask to singulate the components.

4. The method of claim 1, wherein said adhering a stretchable tape to the backsides of the two-dimensional array of components comprises:
   adhering a first tape to the mask; and
   replacing said first tape with said stretchable tape.

5. The method of claim 1 wherein said stretchable tape is tape compatible with pick and place tools.

6. The method of claim 4 wherein said first tape is replaced with said stretchable tape by temporarily bonding a substrate to front sides of the singulated components; removing the first mentioned tape and adhering the stretchable tape to locations from where the first mentioned tape was removed.

* * * * *